United States Patent [19]

Ema

[11] Patent Number: 5,325,327
[45] Date of Patent: Jun. 28, 1994

[54] NON-VOLATILE MEMORY, SEMICONDUCTOR MEMORY DEVICE HAVING THE NON-VOLATILE MEMORY

[75] Inventor: Taiji Ema, Kawasaki, Japan

[73] Assignee: Fujitsu Limited, Kawasaki, Japan

[21] Appl. No.: 846,008

[22] Filed: Mar. 4, 1992

[30] Foreign Application Priority Data

Mar. 4, 1991 [JP] Japan .................................. 3-037461

[51] Int. Cl.$^5$ .............................................. G11C 11/40
[52] U.S. Cl. ...................................... 365/185; 365/182
[58] Field of Search ............ 365/182, 185, 51, 189.01, 365/230.01

[56] References Cited

U.S. PATENT DOCUMENTS

| | | | |
|---|---|---|---|
| 4,672,580 | 6/1987 | Yau et al. | 365/189.01 |
| 5,057,448 | 10/1991 | Kuroda | 437/52 |

FOREIGN PATENT DOCUMENTS

| | | |
|---|---|---|
| 0258141 | 3/1988 | European Pat. Off. |
| 0395084 | 10/1990 | European Pat. Off. |
| 0415530 | 3/1991 | European Pat. Off. |
| 179569 | 7/1988 | Japan . |
| 259556 | 10/1989 | Japan . |
| 35771 | 2/1990 | Japan . |

OTHER PUBLICATIONS

Patent Abstracts of Japan, vol. 13, No. 534 (E-852) Nov. 29, 1989 & JP-A-1 218061 (Hitachi Ltd) Aug. 31, 1989.
Atsumi et al., "Non-Volatile and Fast Static Memories," 1990 IEEE International Solid-State Circuits Conference Digest of Technical Papers, Feb. 14, 1990, San Francisco, Calif., pp. 58-59.
Patent Abstracts of Japan, vol. 14, No. 133 (E-902) [4076] Mar. 13, 1990 & JP-A-2 000356 (Hitachi Ltd) Jan. 5, 1990.
Patent Abstracts of Japan, vol. 15, No. 170 (E-1062) Apr. 30, 1991 & JP-A-3 038061 (Fujitsu Ltd) Feb. 19, 1991.

Primary Examiner—Terrell W. Fears
Attorney, Agent, or Firm—Staas & Halsey

[57] ABSTRACT

A non-volatile memory device includes a semiconductor layer, floating gates, control gates, pairs of first and second impurity diffused layers formed in the semiconductor layer and located on both sides of the control gates Word lines are electrically connected to the control gates, and bit lines are electrically connected to the first impurity diffused layers and perpendicular to the word lines Wiring electrodes are electrically connected to the second impurity diffused layers, and run in a direction in which the bit lines run. Areas including the pairs of first and second impurity diffused areas are obliquely arranged with respect to the bit lines.

11 Claims, 10 Drawing Sheets

$Q_{11}, Q_{12}, Q_{21}, Q_{22}$ : EEPROM $Q_{11}, Q_{12}, Q_{21}, Q_{22}$ : EEPROM

NON-VOLATILE MEMORY, SEMICONDUCTOR MEMORY DEVICE HAVING THE NON-VOLATILE MEMORY

BACKGROUND OF THE INVENTION (1) Field of the Invention

The present invention generally relates to semiconductor memory devices, and more particularly to a non-volatile memory element, such as an EEPROM cell. Further, the present invention is concerned with a composite semiconductor memory device having a chip on which different-type memory cells, such as an EEPROM (Electrically Erasable and Programmable Read Only Memory) and a DRAM (Dynamic Random Access Memory), are formed. Furthermore, the present invention is concerned with a method of producing such a "composite" semiconductor memory device.

(2) Description of the Prior Art

FIG. 1A is a cross-sectional view of a conventional EEPROM cell. The EEPROM cell shown in FIG. 1A includes a p-type semiconductor layer La, a gate insulating film Lb formed on the layer La, a floating gate Lf formed on the gate insulating film Lb, an insulating film Le covering the floating gate Lf, a control gate Lc formed on the insulating film Le and located above the floating gate Lf, and two n+-type impurity diffused layers Ld formed in the semiconductor layer La and located on respective opposite sides of the control gate Lc. A bit line BL is connected to one of the two n+-type diffused layers Ld, and a bulk line Vss is connected to the other n+-type diffused layer Ld. The bit line BL and the bulk line Vss are connected to respective n+-type diffused layers of other EEPROM cells. FIG. 1B shows a symbol i.e., schematic indication of the above EEPROM shown in FIG. 1A. The control gate Lc is connected to a word line WL.

A Fowler Nordheim write process (hereinafter simply referred to as an FN write process) is a known data writing process. In the FN write process, the two n+-type diffused layers Ld are grounded and a high voltage of, for example, 15 V is applied to the control gate Lc. An electric field derived from the control gate Lc absorbs electrons in the semiconductor layer La, and electrons passing through the gate insulating film Lb are captured by the floating gate Lf. In this manner, data is written into the EEPROM cell.

According to the above FN write process, it is not necessary to apply a voltage to the n+-type diffused layer Ld, and current does not flow in the bit line BL. Hence, it is possible to use a simple and low power consumption voltage control circuit used for writing data into the EEPROM cell.

However, it is impossible to apply the FN write process to a memory circuit in which a plurality of EEPROM cells are arranged in rows and columns, as shown in FIG. 2. In FIG. 2, the bulk line Vss and the bit line BL are set to a ground potential in order to select a first cell M11, and a voltage of 15 V is applied to a word line WL1. Simultaneously, a voltage of 15 V is applied to the control gate Lc of a second cell M21, and hence a charge flows into the floating gate Lf of the cell M21. Hence, data is written into not only the cell M11 but also the cell M21. That is, it is impossible to select only the cell M11.

With the above in mind, the following data write process has been used. A voltage of 12 V is applied to the word line WL1 connected to the first cell M11 which is to be selected, and the bulk line Vss is set to the ground potential. Further, a voltage of 6 V is applied to the bit line BL1. In this case, a hot carrier is generated in a channel formation area of the first cell M11. The hot carrier passes through the gate insulating film Lb, and flows into the floating gate Lf. In this manner, data is not written into the other cells M12, M21 and M22.

However, the above data writing process has a disadvantage in that a current flows in the bit line BL, and hence a large amount of energy is consumed. Further, the above-mentioned data writing process has a disadvantage in that data stored in other memory cells may be erased during the above data writing operation. That is, when the word line WL2 is set to the ground level, which switches the channel to the OFF state and which is equal to the substrate ground level, the voltage 6 V is applied to the bit line BL1, and when the bulk line Vss is set to the ground level in the state in which a charge is stored in the floating gate Lf of the cell M12 which is not currently selected, the charge in the floating gate Lf is absorbed in one of the two n+-type diffused layers Ld, and the cell M12 switches to a data erased state.

It may be possible to reduce the voltage applied to the bit line BL in order to the above disadvantage. However, it becomes difficult to write data into the cell by a reduced bit-line voltage.

Conventionally, EEPROMs and DRAMs are formed on separate chips. However, as the feature scale is decreasing to a limit, it becomes more attractive to study how to increase the additional values of chips. For example, EEPROM cells and DRAM cells are formed on a single chip.

The EEPROM needs three wiring layers, that is, two polysilicon layers used for forming the floating gate Lf and the control gate Lc, and an aluminum layer used for forming the bit line BL. As shown in FIG. 3, the DRAM needs five wiring layers, that is, four polysilicon layers used for forming a gate electrode Li (formed on an insulating film Lh), a storage electrode Lk, a cell plate Ll and a bit line Lm, and an aluminum layer used for forming a wiring electrode Ln. A stacked capacitor Lj is composed of the storage electrode Lk, a dielectric film which is formed surround the storage electrode, and the cell plate L1. Since the number of wiring layers in the EEPROM is different from that in the DRAM, it is necessary to separately form the EEPROM cells and the DRAM cells on the single chip by respective different production processes. This increases the production cost and time. It should be particularly noted that the bit line BL, the storage electrode Lk and the cell plate Ll of the DRAM shown in FIG. 3 are not used in the EEPROM.

SUMMARY OF THE INVENTION

It is a general object of the present invention to provide a semiconductor memory device in which the above disadvantages are eliminated.

A more specific object of the present invention is to provide a semiconductor memory device which is suitable for the aforementioned FN write process and which has a layer structure which can be produced by a single production process which is common to a non-volatile memory cell and a volatile memory cell.

The above objects of the present invention are achieved by a non-volatile memory device which comprises a semiconductor layer; floating gates formed on a first insulating film in turn formed on said semiconductor layer; control gates which are respectively formed on a second insulating film in turn formed on the first insulating film and which are respectively located above said floating gates; pairs of first and second impurity diffused layers formed in said semiconductor layer and located on respective, opposite sides of said control gates; word lines electrically connected to said control gates; bit lines electrically connected to the first impurity diffused layers and extending perpendicularly to said word lines; and wiring electrodes electrically connected to the second impurity diffused layers, said wiring electrodes running in the same direction in which said bit lines run. Areas including said pairs of first and second impurity diffused areas are obliquely arranged with respect to said bit lines.

Another object of the present invention is to provide a semiconductor memory device which includes the above non-volatile memory and a volatile memory, both of which are formed on a single semiconductor layer.

This object of the present invention is achieved by a semiconductor memory device which comprises a semiconductor layer; floating gates formed on a first insulating film in turn formed on said semiconductor layer; control gates which are respectively formed on a second insulating film in turn formed on the first insulating film and which are respectively located above said floating gates; pairs of first and second impurity diffused layers formed in said semiconductor layer and located on respective opposite sides of said control gates; first word lines electrically connected to said control gates; first bit lines electrically connected to the first impurity, diffused layers and extending perpendicularly to said word lines; wiring electrodes electrically connected to the second impurity diffused layers; said control gates, said floating gates, said pairs of first and second impurity diffused layers, said first word lines, and said first bit lines forming non-volatile memory elements, said wiring electrodes running in the same direction in which said first bit lines run, second word lines formed on said first or second insulating layer; pairs of third and fourth impurity diffused layers formed in said semiconductor layer and located on respective opposite sides of said second word lines; second bit lines electrically connected to the third impurity diffused layers; and capacitors electrically connected to the fourth impurity diffused layers, said capacitors including storage electrodes, and wherein said second word lines, said pairs of third and fourth impurity diffused layers, said second bit lines, and said capacitors forming volatile memory elements, said storage electrodes and said wiring electrodes are layers formed from a first conductive layer.

Yet another object of the present invention is to provide the method of producing the above-mentioned memory device.

This object of the present invention is achieved by a method of producing a semiconductor memory device comprising the steps of: a) forming floating gates of non-volatile memory elements on a first insulating film on a semiconductor layer; b) forming a second insulating film on said floating gates; c) simultaneously forming, on said second insulating film, control gates located above said floating gates, and gate electrodes of volatile memory elements; d) simultaneously forming pairs of first and second impurity diffused layers located on both sides of said control gates serving as masks, and pairs of third and fourth impurity diffused layers located on both side of said gate electrodes serving as masks; e) forming a third insulating film so that said third insulating film covers said control gates and said gate electrodes; f) simultaneously forming first bit lines connected to said first impurity diffused layers via contact holes formed in said third insulating film, and second bit lines connected to said third impurity diffused layers via contact holes formed in said third insulating film; g) simultaneously forming wiring electrodes electrically connected to the second impurity diffused layers, and storage electrodes of capacitors electrically connected to said fourth impurity diffused layers; h) forming dielectric films surrounding said storage electrodes; and i) forming a cell plate so that said cell plate covers said storage electrodes which are surrounded by said dielectric films.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1A:
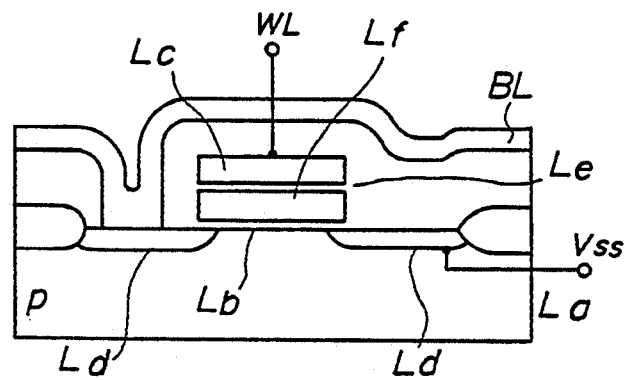
FIG. 1A is a cross-sectional view of a conventional EEPROM.
Figure 1B:
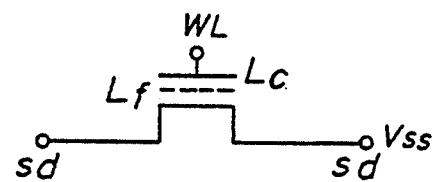
FIG. 1B is a circuit diagram of the EEPROM.
Figure 2:
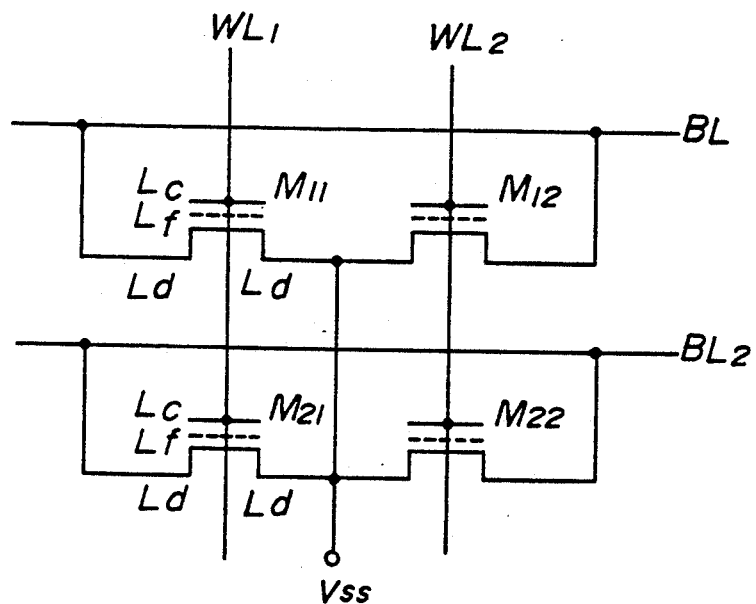
FIG. 2 is a circuit diagram of a memory array of EEPROM cells.
Figure 3:
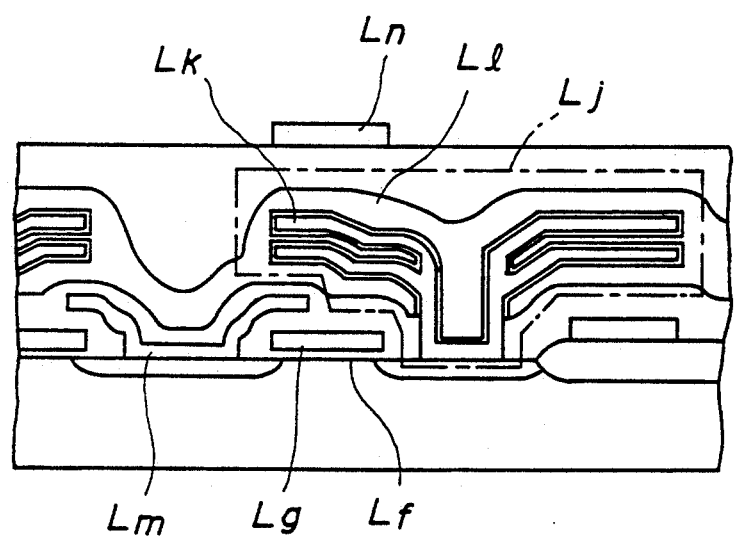
FIG. 3 is a cross-sectional view of a conventional DRAM.
Figure 4:
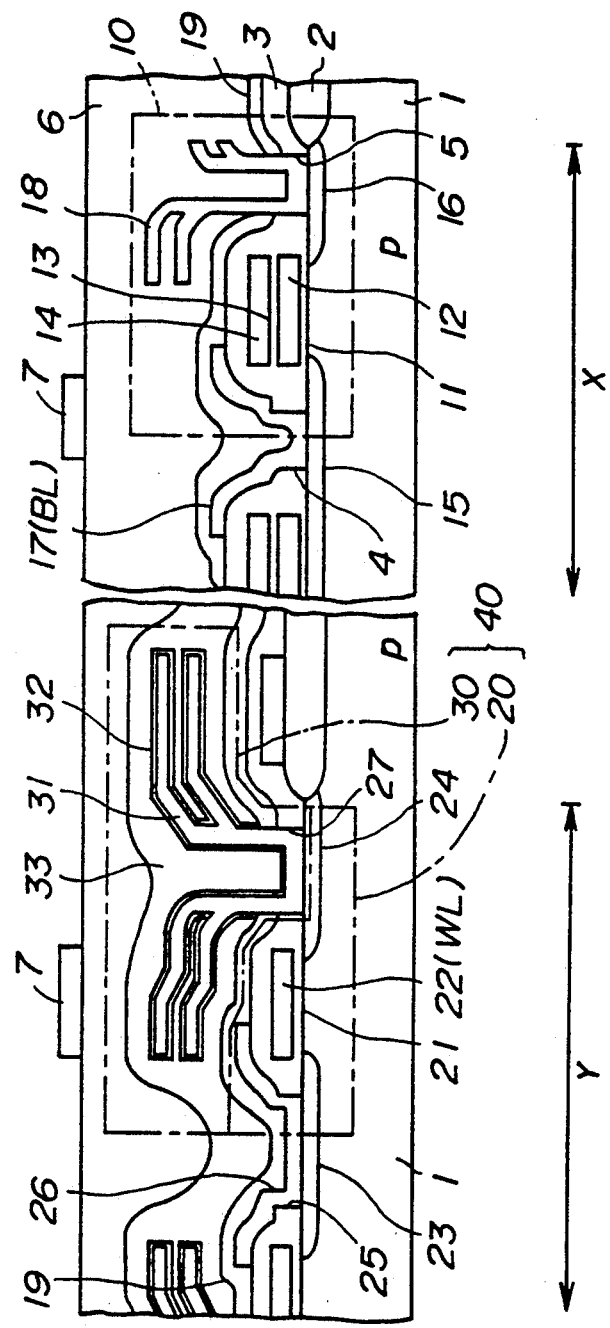
FIG. 4 is a cross-sectional view of an embodiment of the present invention.
Figure 5:
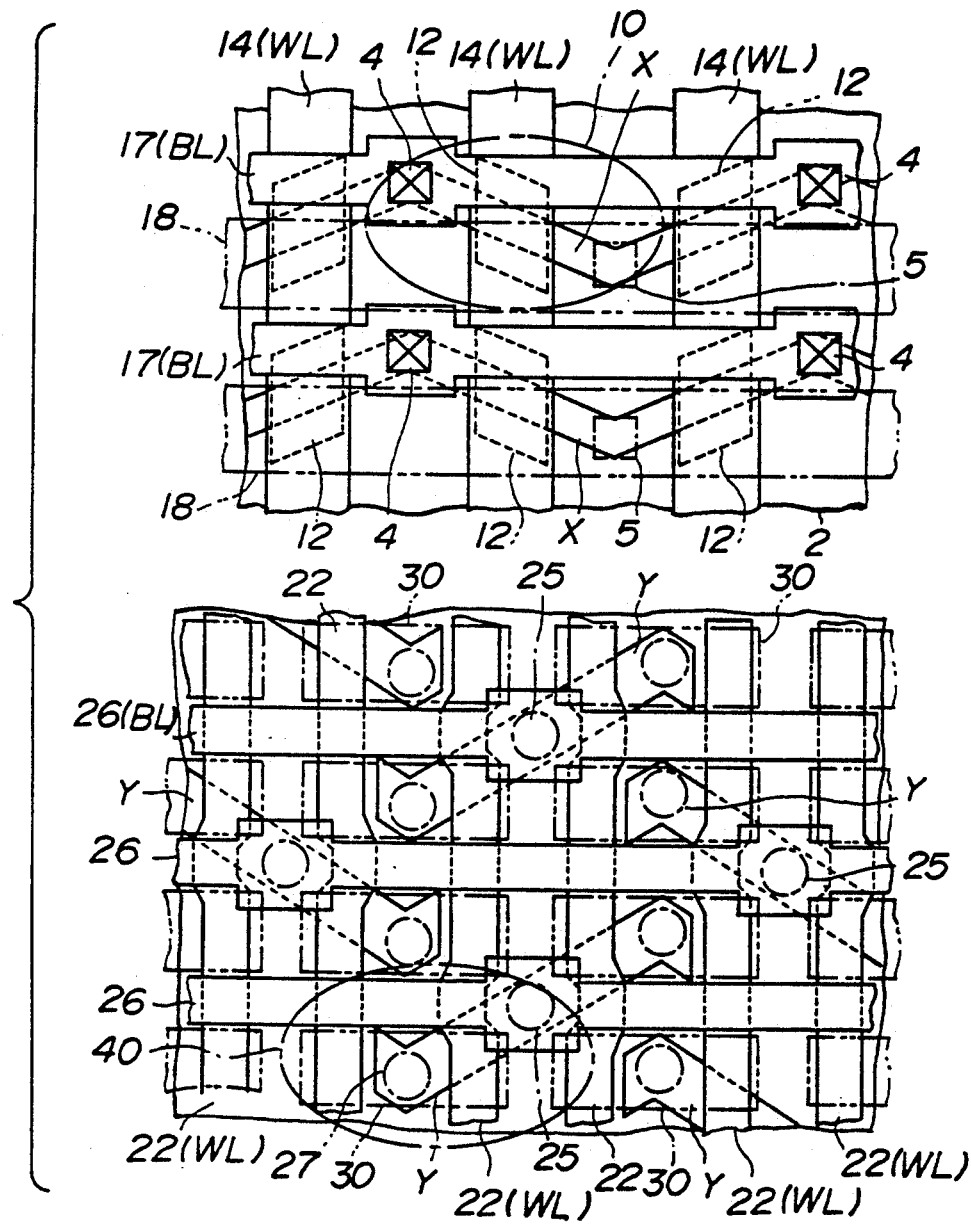
FIG. 5 is a plan view of the embodiment of the present invention.

FIG. 4 is a cross-sectional view of a memory device having an EEPROM cell and a DRAM cell, both of which cells are formed on a single semiconductor substrate 1. FIG. 5 is a plan view showing EEPROM cells arranged in rows and columns and DRAM cells arranged in rows and columns. The semiconductor substrate 1 is a p-type semiconductor layer. A field oxide film 2 is formed on a main surface of the semiconductor substrate 1 so that it defines element formation areas (active areas) X and Y. An EEPROM cell 10 is formed in the element formation area X, and a DRAM cell 40 comprising a transfer transistor 20 and a fin-type capacitor 30, is formed in the element formation area Y. The element formation area X has less-than-sign-shaped or waveform-shaped portions and extends in a zigzag pattern of successive, oppositely angled portions. In actuality, a plurality of element formation areas are arranged side by side as shown in FIG. 5.

The EEPROM cell 10 has an insulating film 11 made of, for example, $SiO_2$, which is formed on the semiconductor substrate 1. A floating gate 12 is formed on the insulating film 11, which is covered by an insulating film 13. A control gate 14 is formed on the insulating film 13 and located above the floating gate 12. As shown in FIG. 4, $n^+$-type diffused layers 15 (source) and 16 (drain) are formed in the semiconductor substrate 1 and located on both sides of the control gate 14. The control gate 14 extends in the width direction of the gate, and is integrally formed with the other control gates. These integrated control gates 14 form a word line WL.

A bit line 17 (BL) is formed on an interlayer insulating film 3 covering the EEPROM cell 10. The bit lines 17 cross the word lines WL and extends in the direction and crosses the bent or anded portions of the element formation areas X. The bit line 17 is electrically connected to the n+-type diffused layers 15 via respective contact holes 4 formed in the interlayer insulating film 3. An $Si_3N_4/SiO_2$ insulating film 19 is formed on the interlayer insulating film 3 and the bit lines 17. Wiring electrodes 18, which run in the same direction as the bit lines 17, are formed on the insulating film 19. The wiring electrodes 18 are electrically connected to the n+-type diffused layers 16 via contact holes formed in the insulating film 19 and the interlayer insulating film 3.

The transfer transistor 20 of the DRAM cell 40 comprises a gate electrode 22 (formed on an insulating film 21 on the semiconductor layer 1), and n+-type diffused layers 23 and 24 formed in the semiconductor substrate 1 and located on respective, opposite sides of the gate electrode 22. The interlayer insulating film 3 is formed on the transfer transistor 20. As shown in FIG. 5, a plurality of gate electrodes 22, which extend in the width direction of the gates, are integrally formed with the other gate electrodes. The integrated gate electrodes form a word line WL.

Each bit line 26 is formed on the interlayer insulating film 3 and electrically connected to the n+-type diffused layer 23 via a respective contact hole 25 formed in the interlayer insulating film 3. An insulating film 19 is formed on the bit lines 26 and the interlayer insulating film 3. The capacitor 30 extends above the insulating film 19. The capacitor 30 is composed of a fin-shaped storage electrode 31, a dielectric film 32 formed around (i.e., the surrounding) the storage electrode 31, and a cell plate 33 covering the dielectric film 32. The storage electrode 31 is electrically connected to the n+-type diffused layer 24 via a contact hole 27 formed in the interlayer insulating film 3 and the insulating film 19. An interlayer insulating film 6 made of, for example, PSG (PhosphoSilicate Glass), covers the EEPROM and DRAM cells. Aluminum wiring lines 7 are formed on the interlayer insulating film 6.

As has been described previously, the n+-type diffused layer 15 is connected to the bit line 17, and the n+-type diffused layer 16 is connected to the wiring electrode 18. Hence, by integrally forming, in the row direction, the wiring electrodes 18 of a plurality of EEPROM cells 10 arranged in rows and columns and separating rows of the integrally formed wiring electrodes from each other in the column direction, it becomes possible to apply different voltages to the impurity diffused layers 16 in the different columns. The control gates 14 of the EEPROM cells 10 are integrally formed with each other in each column. The word lines WL1 and WL2 are formed in this manner. The word lines WL1 and WL2 extend in the direction perpendicular to the direction in which the bit lines BL1 and BL2 and the wiring electrodes 18 extend.

Figure 6:
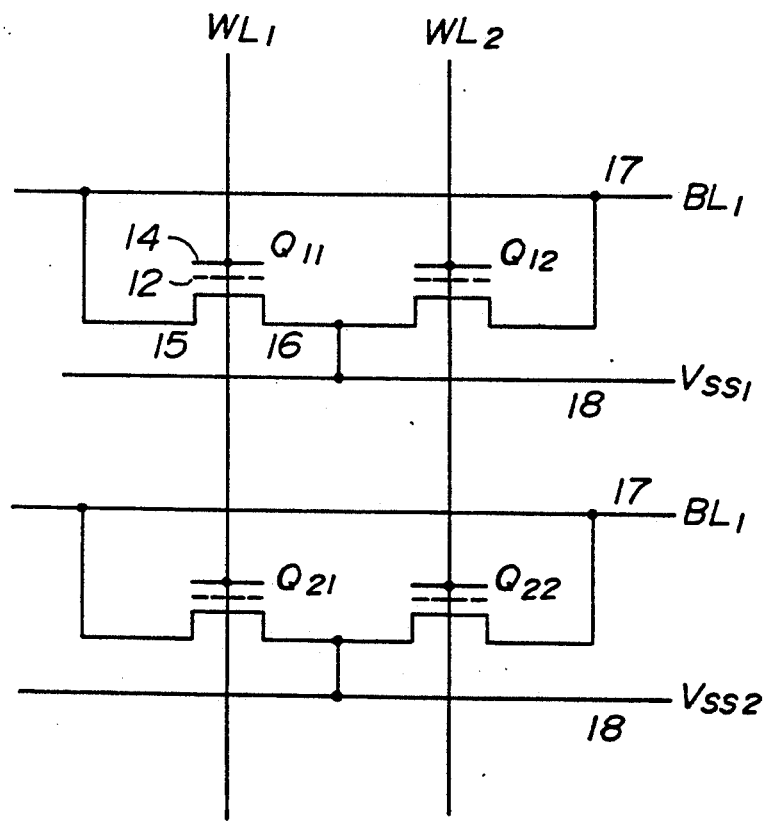
FIG. 6 is a circuit diagram of an EEPROM cell array of the embodiment of the present invention.

FIG. 6 is a circuit diagram of an EEPROM cell array having the structure shown in FIGS. 4 and 5. Data is written into a selected EEPROM cell as follows. A positive voltage is applied to the word line WL1 of Q11, and a zero-volt voltage is applied to the bit line BL1 and the wiring electrode line 18 (Vss1) of the selected cell Q11. An intermediate level voltage, between the respective levels of the positive voltage and the zero-volt voltage is applied to the word line WL2, the bit line BL2 and the wiring electrode line 18 (Vss2) of the unselected cells Q21, Q12 and Q22. When data is erased from the EEPROM Q11, a zero-volt voltage is applied to the word line WL1 connected to the cell Q11, and the positive voltage is applied to at least one of the bit line BL1 and the wiring electrode line Vss1. Further, the intermediate level voltage is applied to the bit line BL2 and the wiring electrode line Vss2, and the word line WL2.

When data is written into, for example, the EEPROM cell Q11, a voltage of 12 V is applied to the word line WL1, and the bit line BL1 and the wiring electrode line 18 connected to the cell Q11 are grounded Further, the intermediate level voltage equal to for example, 6 V, is applied to the word line WL2, the bit line BL2 and the other wiring electrode line 18. Under this condition, electrons in the semiconductor substrate 1 of the EEPROM cell Q11 pass through the insulating film 11, and enter into the floating gate 12. The voltage difference between the control gate 14 and the semiconductor substrate 1 in each of the other EEPROM cells Q12, Q21 and Q22 is approximately equal to 6 V, while the voltage difference between them in the EEPROM cell Q11 is approximately equal to 12 V. Hence in the EEPROM cells Q12, Q21 and Q22, electrons do not flow into the floating gates 12.

The data stored in the EEPROM cell Q11 is erased therefrom in the following manner. A voltage of 6 V is applied to the bit line BL1 and the wiring electrode line 18 connected to the cell Q11, and the word line WL1 is grounded Further, a voltage of 6 V is applied to the bit line BL2, the other wiring electrode line 18 and the word line WL2. Thereby, a charge captured by the floating gate 12 moves the source and drain 15 and 16 due to the function of the electric field.

In the manner as described above, data can be written into the EEPROM cell array by the FN write process. In addition, less current flows in the bit lines BL, and hence only a small amount of energy is consumed during the write operation. The process of pouring flowing the charge into the floating gate 12 is the write operation, and the process of removing the charge from the floating gate 12 is the erase operation. On contrary, the write process may be the charge removing process, and the erase process may be the charge pouring process. In this alternative, the reverse voltage control is carried out.

More specifically, when data is written into a selected EEPROM cell Q, the word line WL connected thereto is set to the zero potential, and at least one of the bit line BL and the wiring electrode line Vss connected thereto is set to the positive potential. Further, the other word lines WL, the other bit lines BL and the other wiring electrode line Vss are set to the intermediate level potential. When the data is erased from the selected EEPROM cell Q, the word line connected thereto is set to the positive voltage, and at least one of the bit line BL and the wiring electrode line Vss connected thereto is set to the zero potential. Further, the other word line WL, the other bit lines BL and the other wiring electrode lines Vss are set to the intermediate level potential.

When data stored in all the cells are erased at one time, a high voltage is applied to all the word lines WL and all the bit lines BL and the Vss line are set to zero volt. At this time, it is enough for each cell to have a threshold voltage equal to or greater than a predetermined voltage Hence, it is not necessary to pay attention to the differences among the threshold voltages of the cells. The above is a great advantage of the present invention.

A description will now be given, with reference to FIGS. 7A through 7K, of the production process of the above-mentioned semiconductor memory device.

Figure 7A:
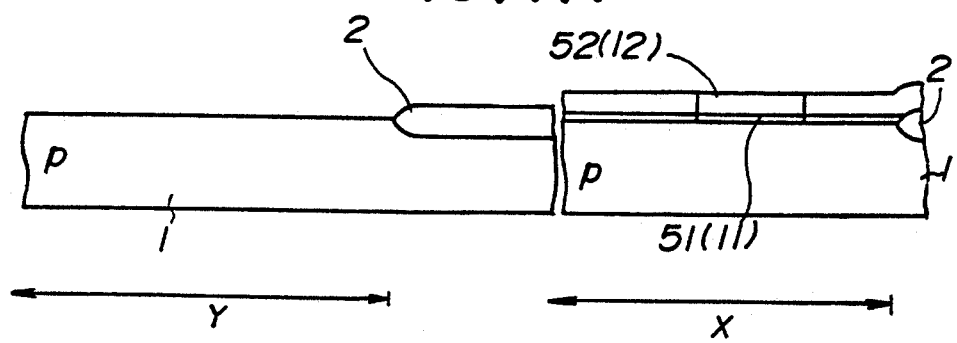
FIGS. 7A through 7K are cross-sectional views showing the production steps of producing the embodiment of the present invention.

As shown in FIG. 7A, the element formation areas X and Y in the p-type semiconductor substrate 1 are defined by the field oxide film 2. Next, the respective surface of the element formation areas X and Y are thermally oxidized, and thereby an SiO$_2$ film (insulating film 11) is formed to a thickness of 100Å. Then, a polysilicon film is deposited to a thickness of 500Å on the entire surface and patterned by a photolithograph process so that a belt-shaped portion of the polysilicon film 52 remains in the element formation area X. This polysilicon film 52 is the floating gate 12 of the EEPROM cell 10.

Figure 7B:
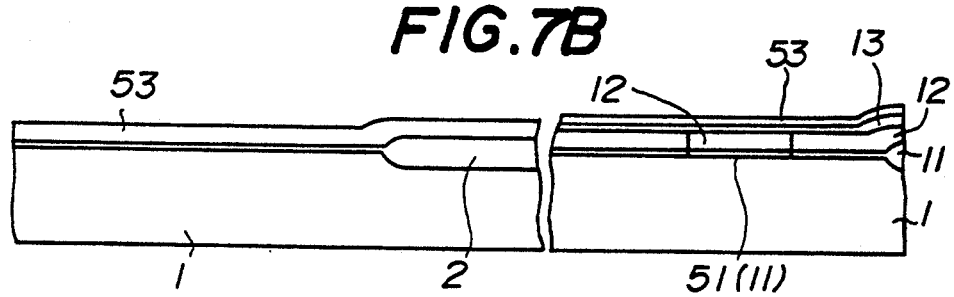
Figure 7C:
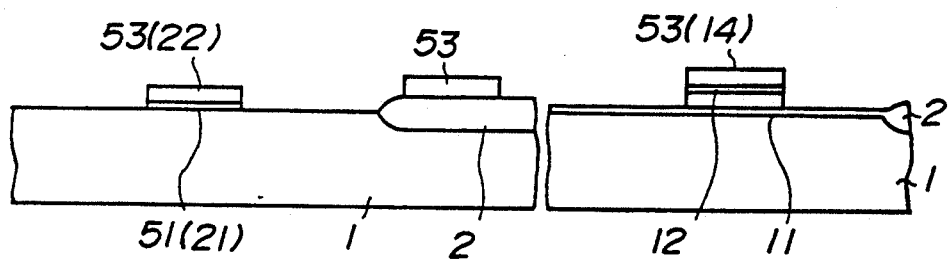

As shown in FIG. 7B, the SiO$_2$ film 13 is formed on the surface portions of the semiconductor substrate 1 in the element formation areas X and Y and the surface of the floating gate 12 by a thermal oxidation process. Then, a polysilicon film 53 is deposited in a thickness of 2000Å on the SiO$_2$ film 13 and patterned by the photolithograph process. During this patterning process, some of the belt-shaped polysilicon film portions 53 extend the element formation area Y, and the remaining portions 53 are located above the floating gates 12 (FIG. 7C). In FIG. 7C, the patterned polysilicon film 53 located above the floating gate 12 is the control gate 14, and the patterned polysilicon film 53 extending in the element formation area Y is the gate electrode 22 of the transfer transistor 20. The control gate 14 extends in the width direction of the gate, and is integrated with the other control gates 14 in the same row. The gate electrode 22 shown in FIG. 7C is integrated with the other gate electrodes 22 in the same row. The integrated gate electrodes 22 forms the word line WL.

Figure 7D:
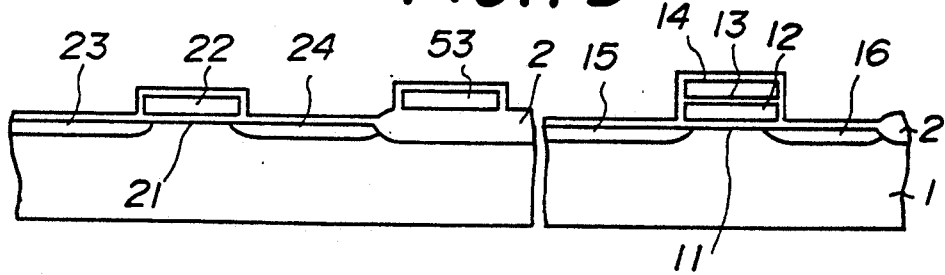

As shown in FIG. 7D, the open or exposed surface portions of the gate electrode 22, the control gate 14 and the semiconductor substrate 1 are thermally oxidized. Then, P ions are injected and diffused into the semiconductor substrate 1, the gate electrode 22 and the control gate 14 being used as mask layers. In this manner, the n+-type impurity diffused layers 23 and 24, located on respective, opposite sides of the gate electrode 22, are formed in the semiconductor substrate 1, and the n+-type impurity diffused layers 15 and 16, located on respective, opposite sides of the control gate 14, are formed therein.

Figure 7E:
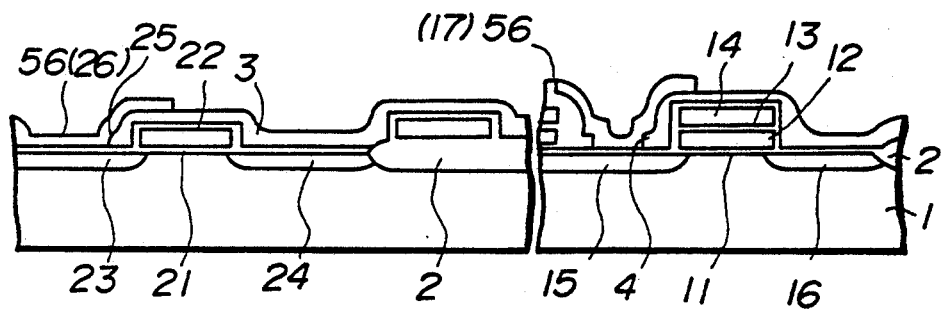

As shown in FIG. 7E, the gate insulating film 3 made of SiO$_2$ is formed in a thickness of 2000Å over the entire surface, and selectively etched by the photolithograph process. In this manner, the contact holes 4 and 25 are formed in the film 3 so that the diffused layers 15 and 23 are partially exposed therethrough, respectively. Then, a polysilicon and stacked WSi film 56 is deposited in a thickness of 2000Å on the entire surface and patterned into a belt shape. In this process, the bit line 26 is formed so that it extends in the gate direction and is in contact with the diffused layers 23 of the transfer transistors 20 via the corresponding contact holes 25 in the element formation area Y. In the same production step, the polysilicon and WSi stacked film 56 is patterned in the belt shape. In this process, the bit line 17 extends in the direction perpendicular to the word lines WL and is in contact with the diffused layers 15 of the EEPROM cells 10 via the contact holes 4 in the element formation area X.

Figure 7F:
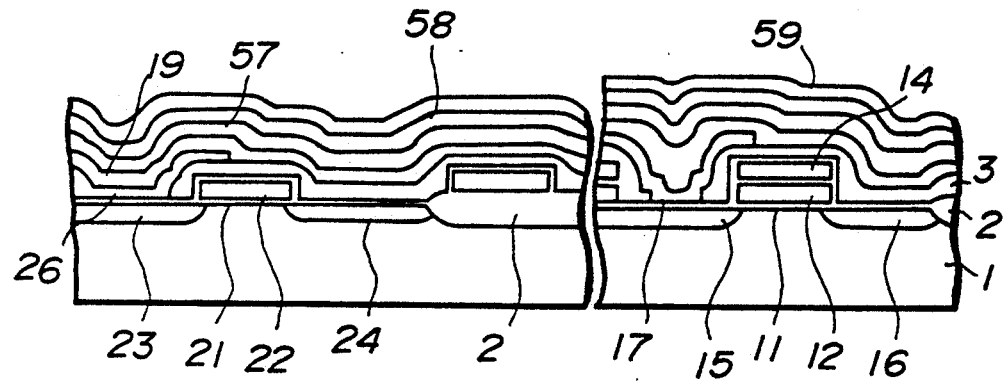

After this, as shown in FIG. 7F, the insulating film 19, having the Si$_3$N$_4$/SiO$_2$ structure, and an SiO$_2$ film 57 are successively formed by a CVD process. Then, a polysilicon film 58 and an SiO$_2$ film 59 are successively formed by the CVD process.

Figure 7G:
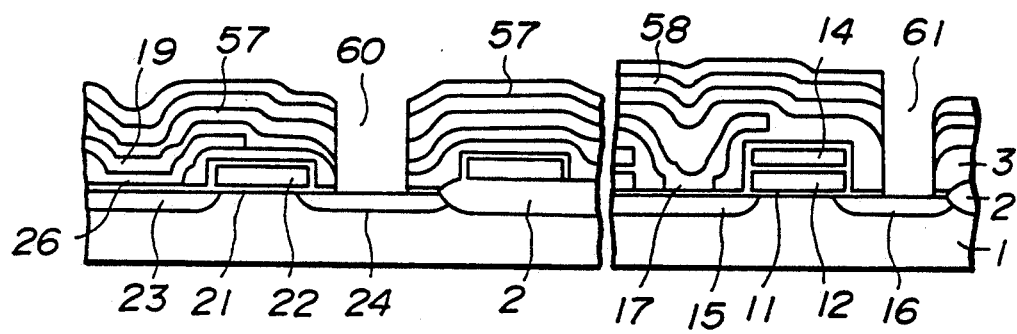

As shown in FIG. 7G, in the element formation areas X and Y, openings 60 and 61 are formed by the photolithograph process so that the n+-type diffused layers 16 and 24 are partially exposed, respectively. In the production step shown in FIG. 7G, each of the films 19 and 57-59 is 1000Å thick, for example.

Figure 7H:
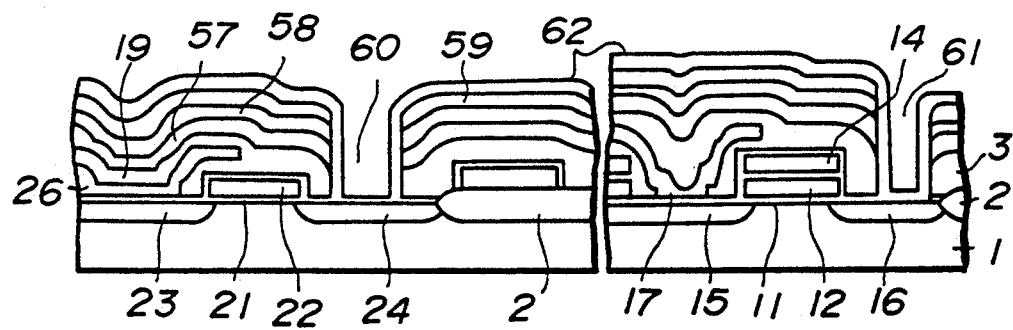
Figure 7I:
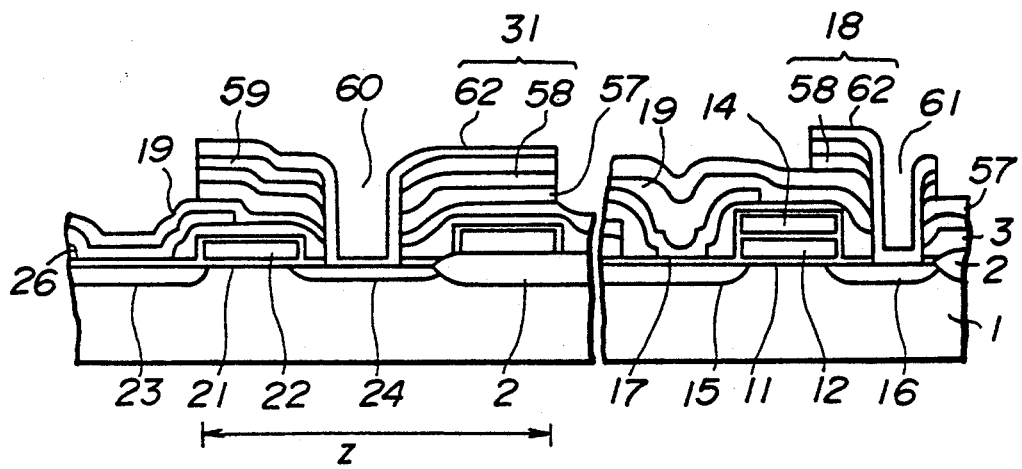

As shown in FIG. 7H, a polysilicon film 62 is grown to a thickness of 1000Å on the SiO$_2$ film 62 and along inner surfaces of the openings 60 and 61. Then, the layers between the polysilicon film 62 located at top and the polysilicon film 58 formed on the SiO$_2$ film 57 are selectively etched by the photolithographic process. In this production step, as shown in FIG. 7I, the films 57 and 58-62 remain in a storage electrode formation area Z including the contact hole 61 in the element formation area Y, and remain in an area where they extends into the contact hole 61 in the element formation area X. Then, all the SiO$_2$ film portions on the insulating film 19 are removed by a hydroflouric acid solution. Thereby, the polysilicon films 58 and 62 remain in the fin shape. The fin-shaped polysilicon films 58 and 62 form the storage electrode 31. The fin-shaped polysilicon films 58 and 62 connected to the n+-type diffused layer 16 remain in the opening 61 in the element formation area X, and form the wiring electrode 18 of the EEPROM cell 10. The wiring electrode 18 is arranged on the insulating film 19 in the same direction as the bit line 17 so that it shortcircuits the n+-type diffused layers 16 of a group of EEPROM cells 10.

Figure 7J:
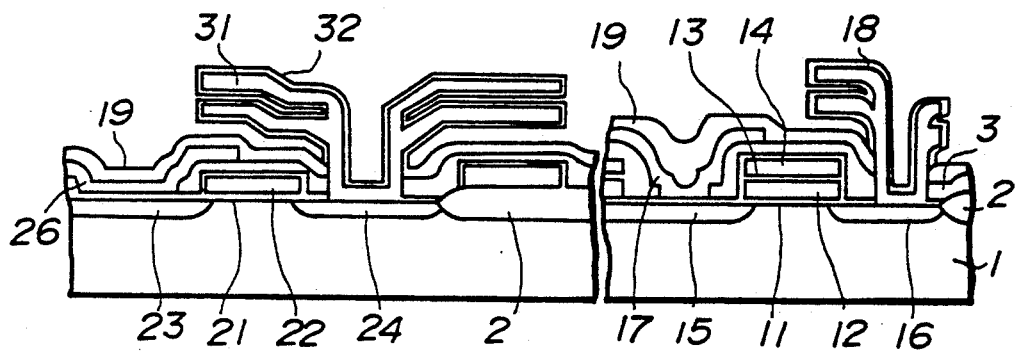

As shown in FIG. 7J, an SiN/SiO$_2$ film is uniformly grown on the surface of the storage electrode 31 by the CVD process. The SiO$_2$ film thus formed is the dielectric film 32. Although the SiN/SiO$_2$ film is formed on the wiring electrode 18, a problem will not arise from it.

Figure 7K:
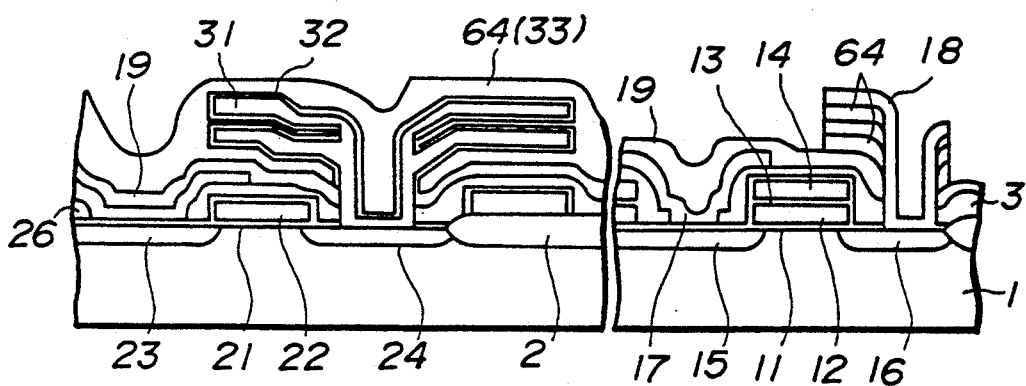

As shown in FIG. 7K, a polysilicon film 64 is formed on the entire surface by the CVD process. After this, the storage electrode 31 and its peripheral wiring electrode 18 are covered by a resist mask (not shown), and the exposed polysilicon film 64 is removed by a reactive ion etching method. In this manner, the polysilicon film 64 remains around i.e., surrounding the storage electrode 31, and serves as the cell plate 33. A recess portion of the storage electrode 18 is filled with the polysilicon film 64, so that the mechanical strength of the wiring electrode 18 is enhanced. Then, the interlayer insulating film 6 made of PSG is formed, and thermally re-flown. After this, the aluminum wiring electrodes 7 are formed.

In the above-mentioned production process, the EEPROM cells 10 and the DRAM cells 40 are formed. It will be noted that the gate electrodes 22 of the DRAM cells 40 and the control gates 12 of the EEPROM cells 10 are formed by the common production step. It will further be noted that the storage electrodes 14 and the wiring electrodes 18 are formed by a common production step. It will be furthermore noted that the bit lines 26 of the DRAM cells 40 and the bit lines 17 of the EEPROM cells 10 are formed by a common production step. As a result, the wiring production process of the present invention is extremely simplified, as compared with the prior art. When the wiring lines are formed of polysilicon, impurities are introduced therein so that they have a respective desired conductivity.

The present invention is not limited to the EEPROM cells, but includes other non-volatile memory elements, such as EPROM cells. The present invention is not limited to the fin type DRAM cells, but includes other volatile memory cells, such as cylindrical memory cells, and box-type memory cells.

According to the present invention, the wiring electrode of the non-volatile memory cell is formed on and connected to the impurity diffused layer to which the bit line is not connected, and extends in the same direction as the bit line extends. With this structure, it becomes possible to apply, separately from the voltage applied to the bit line, a voltage signal to the impurity diffused layer to which the bit line is not connected. Hence, data can be written into the non-volatile memory cells by the FN write process.

According to the present invention, the active regions, of the non-voltage memory elements are in a zigzag pattern, or arrangement, relative to the bit lines. With this structure, it becomes possible to connect one of the two impurity diffused layers and the bit line to each other in a reduced area and connect the other impurity diffused layer and the wiring layer to each other in a reduced area.

According to the present invention, the wiring electrode of the non-volatile memory cell can be formed by the same layer as the storage electrode of the capacitor of the volatile memory cell, and can be formed at the same time as the storage electrode. As a result, the semiconductor memory device of the present invention can be produced by a simplified production process.

According to the present invention, the control gate of the EEPROM cell can be simultaneously formed by the same layer as the gate electrode of the transistor of the DRAM cell. Similarly, the bit line of the EEPROM cell can be simultaneously formed by the same layer as the bit line of the DRAM cell. Further, the wiring electrode of the EEPROM cell which is to be connected to the impurity diffused layer can be simultaneously formed by the same layer as the storage electrode of the capacitor of the DRAM cell. As a result, the composite semiconductor device can be manufactured by the simplified production process.

The present invention is not limited to the specifically disclosed embodiments, and variations and modifications may be made without departing from the scope of the present invention.

What is claimed is:

1. A non-volatile memory device comprising:
   a semiconductor layer;
   a first insulating film formed on said semiconductor layer;
   floating gates formed on said first insulating film;
   a second insulating film formed on said floating gates;
   control gates respectively formed on said second insulating film and located above respective said floating gates;
   pairs of first and second impurity diffused layers formed in said semiconductor layer and located on respective, opposite sides of corresponding said control gates;
   word lines electrically connected to respective said control gates;
   bit lines electrically connected to respective, said first impurity diffused layers and extending perpendicularly with respect to said word lines;
   wiring electrodes electrically connected to respective, said second impurity diffused layers, said wiring electrodes extending in a common direction in which said bit lines extend; and
   said pairs of first and second impurity diffused layers being formed in corresponding areas of said semiconductor layer, said areas extending obliquely with respect to said bit lines.

2. A non-volatile memory device as claimed in claim 1, wherein said areas extend in a zigzag pattern of successive and oppositely oriented areas, each area forming an oblique angle with respect to said bit lines.

3. A non-volatile memory device as claimed in claim 1, wherein said wiring electrodes and said bit lines are formed on respective, different insulator films.

4. A non-volatile memory device as claimed in claim 3, wherein each of said wiring electrodes has a fin-shaped structure comprising at least one vertical portion and at least one fin, said at least one vertical portion being connected to one of the second impurity diffused layers and said at least one fin extending substantially horizontally from a corresponding said vertical portion.

5. A non-volatile memory device as claimed in claim 2, wherein said bit liens are in contact with respective, said first impurity diffused layers, each bit line contacting a corner portion of each of said respectively corresponding areas of said zigzag pattern.

6. A semiconductor memory device comprising:
   a semiconductor layer;
   a first insulating film formed on said semiconductor layer;
   floating gates formed on said first insulating film;
   a second insulating film formed on said floating gates;
   control gates respectively formed on said second insulating film and located above respective said floating gates;
   pairs of first and second impurity diffused layers formed in said semiconductor layer and located on respective, opposite sides of corresponding said control gates;
   first wold lines electrically connected to respective said control gates;
   first bit lines electrically connected to respective, said first impurity diffused layers and extending perpendicularly with respect to said word lines;
   wiring electrodes electrically connected to respective, said second impurity diffused layers;
   said control gates, said floating gates, said pairs of first and second impurity diffused layers, said first word lines, and said first bit lines forming non-volatile memory elements,
   said wiring electrodes extending in a common direction in which said first bit lines extend;
   second word lines formed on said first insulating layer;
   pairs of third and fourth impurity diffused layers formed in said semiconductor layer and located on respective, opposite sides of corresponding said second word lines;
   second bit lines electrically connected to respective, said third impurity diffused layers;
   capacitor electrically connected to respective, said fourth impurity diffused layers, said capacitors including corresponding storage electrodes;
   said second word lines, said pairs of third and fourth impurity diffused layers, said second bit liens, and said capacitors forming volatile memory elements; and said storage electrodes and said wiring electrodes being formed from a common, first conductive layer.

7. A semiconductor memory device as claimed in claim 6, wherein said second word lines and said control gates are formed from a common, second conductive layer.

8. A semiconductor memory device as claimed in claim 6, wherein said first bit lines and said second bit lines are formed from a common, third conductive layer.

9. A semiconductor memory device as claimed in claim 6, wherein said pairs of first and second impurity diffused layers are formed in corresponding areas of said semiconductor layer, said areas extending obliquely with respect to said first bit lines.

10. A semiconductor memory device as claimed in claim 6, wherein each of said wiring electrodes has a first fin-shaped structure, and each of said storage electrodes has a second fin-shaped structure.

11. A semiconductor memory device as claimed in claim 10, wherein each of said first fin-shaped structure and said second fins-shaped structure has a common number of fins.

* * * * *

UNITED STATES PATENT AND TRADEMARK OFFICE
CERTIFICATE OF CORRECTION

PATENT NO. : 5,325,327
DATED : June 28, 1994
INVENTOR(S) : EMA

It is certified that error appears in the above-indentified patent and that said Letters Patent is hereby corrected as shown below:

COVER PAGE: [57] ABSTRACT, line 5, after "gates" insert --.--;
line 8, after "lines" insert --.--.

Col. 1, line 29, after "respective" insert --,--;
line 35, after "indication" insert --,--.

Col. 2, line 44, after "formed"insert --to--;
line 48, after "respective" insert --,--.

Col. 3, line 30, after "respective" insert --,--;
line 32, delete ",";
line 43, after "respective" insert --,--.

Col. 4, line 51, after "40" insert --,--.

Col. 5, line 5, change "extends" to --extend--;
line 6, after "bent" insert --,--; change "anded" to --angled,--.
line 36, delete "the" (first occurrence).

Col. 6, line 16, after "to" (first occurrence) insert --,--;
line 26, after "Hence" insert --,--;
line 41, delete "pouring".
line 15, "grounded" should read --grounded.--.

UNITED STATES PATENT AND TRADEMARK OFFICE
CERTIFICATE OF CORRECTION

PATENT NO. : 5,325,327
DATED : June 28, 1994
INVENTOR(S) : EMA

It is certified that error appears in the above-indentified patent and that said Letters Patent is hereby corrected as shown below:

Col. 8,  line 23, change "extends" to --extend--;
         line 48, after "around" insert --,--; and after "surrounding" insert --,--.

Col. 10, line 24, change "liens" to --lines--;
         line 66, change "liens" to --lines--.

Col. 12, line 11, change "fins-shaped" to --fin-shaped--.

Signed and Sealed this

Third Day of January, 1995

Attest:

BRUCE LEHMAN

Attesting Officer

Commissioner of Patents and Trademarks